US007807554B2

(12) United States Patent
Nakazawa

(10) Patent No.: US 7,807,554 B2
(45) Date of Patent: Oct. 5, 2010

(54) METHOD OF MANUFACTURING SEMICONDUCTOR ELEMENT

(75) Inventor: Haruo Nakazawa, Tokyo (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 154 days.

(21) Appl. No.: 12/071,917

(22) Filed: Feb. 27, 2008

(65) Prior Publication Data

US 2008/0227277 A1 Sep. 18, 2008

(30) Foreign Application Priority Data

Feb. 28, 2007 (JP) .............................. 2007-049087

(51) Int. Cl.
*H01L 21/00* (2006.01)
(52) U.S. Cl. ....................................... 438/530; 438/514
(58) Field of Classification Search ................. 438/514, 438/530
See application file for complete search history.

(56) References Cited

U.S. PATENT DOCUMENTS

| 6,258,680 | B1 * | 7/2001 | Fulford et al. ............... 438/305 |
| 6,365,476 | B1 * | 4/2002 | Talwar et al. ................ 438/308 |
| 6,576,965 | B2 * | 6/2003 | Eikyu et al. .................. 257/408 |
| 6,580,149 | B2 * | 6/2003 | Tran et al. .................... 257/549 |
| 7,011,998 | B1 * | 3/2006 | Ju et al. ........................ 438/197 |
| 7,135,387 | B2 * | 11/2006 | Nakazawa et al. ........... 438/473 |
| 7,297,617 | B2 * | 11/2007 | Farrar et al. ................. 438/546 |
| 2002/0105066 | A1 * | 8/2002 | Eikyu et al. .................. 257/685 |
| 2004/0051109 | A1 * | 3/2004 | Ishizaki et al. ................. 257/89 |
| 2005/0059263 | A1 | 3/2005 | Nakazawa et al. |
| 2006/0006499 | A1 * | 1/2006 | Farrar et al. ................. 257/607 |

FOREIGN PATENT DOCUMENTS

| JP | 2002-520885 | 7/2002 |
| JP | 2003-059856 A | 2/2003 |
| JP | 2004-140101 A | 5/2004 |
| JP | 2005-223301 | 8/2005 |
| JP | 2006-351659 | 12/2006 |
| WO | WO-00/04596 | 1/2000 |

* cited by examiner

*Primary Examiner*—Fernando L Toledo
(74) *Attorney, Agent, or Firm*—Rabin & Berdo, PC

(57) ABSTRACT

A method of manufacturing a semiconductor element includes implanting ions of a dopant having a large diffusion coefficient into a semiconductor to provide a doped layer; and irradiating the doped layer with a plurality of pulsed laser beams supplied by a plurality of laser irradiation devices to activate the doped layer and provide an activated doped layer. The activated doped layer may be one of a single doped layer or a plurality of successive doped layers which each have respective conduction types that are one of identical or different. Device breakage and failure of the manufactured semiconductor element due to heat induced during laser irradiation are substantially prevented by this method.

16 Claims, 10 Drawing Sheets

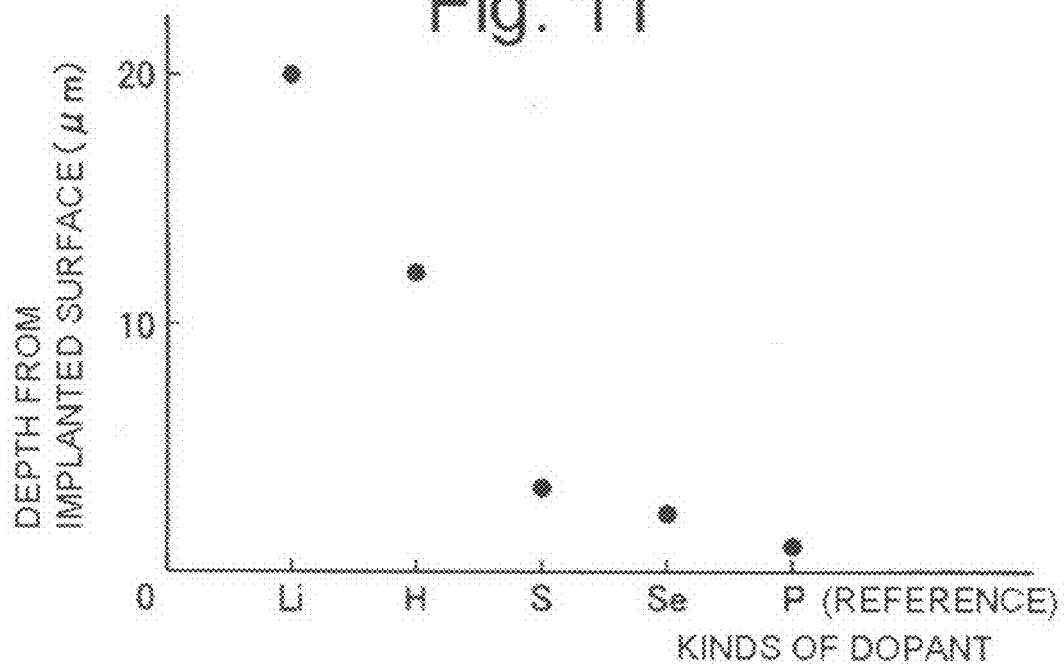
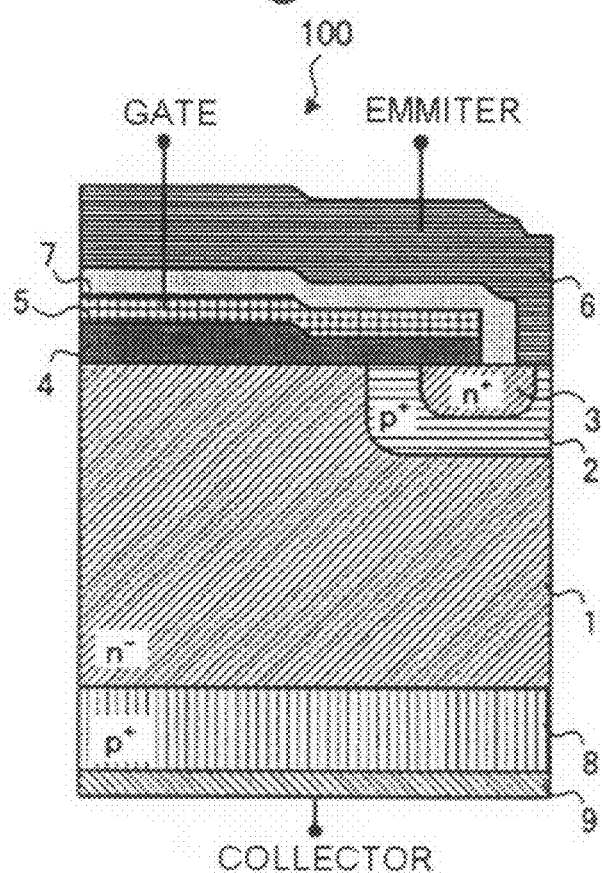

US 7,807,554 B2

METHOD OF MANUFACTURING SEMICONDUCTOR ELEMENT

CROSS-REFERENCE TO RELATED APPLICATION

This Application claims the benefit of priority from Japanese Published Application No. 2007-049087 filed Feb. 28, 2007, the contents of which are incorporated herein by reference.

BACKGROUND OF THE INVENTION

1. Field of the Invention

The present invention relates to a method of manufacturing a semiconductor element, and more particularly, to a method of manufacturing a semiconductor element, such as an IC (Integrated Circuit), a MOS (Metal Oxide Semiconductor), and an insulated gate bipolar transistor (hereinafter, abbreviated to IGBT).

2. Description of the Related Art

In recent years, integrated circuits (ICs) have been most commonly used in important sections in a computer or a communication device. In such ICs, a number of transistors and resistors are connected so as to form electric circuits that are integrated onto one chip. Of these ICs, those including power semiconductor elements are referred to as power ICs.

An IGBT is a power element provided with both the high speed switching and the voltage driving characteristics of a MOSFET and the low on-voltage characteristic of a bipolar transistor. The IGBT has been expanding from industrial applications, which include devices such as general-purpose inverters, AC servo devices, uninterruptible power sources (UPS), and switching power sources, to consumer applications, which include devices such as microwave ranges, electric rice cookers, and strobes. Development directed to next-generation IGBTs also is proceeding. An IGBT having a new chip structure with an even lower on-voltage has been developed so that devices using such IGBTs have reduced loss and enhanced efficiency.

IGBT structures may be mainly classified into types including a punch through (PT) type, a non-punch through (NPT) type, and a field stop (FS) type. Furthermore, almost all currently mass-produced IGBTs have an n-channel type vertical double-diffused structure except for those having a p-channel type structure used for audio power amplifiers. In the following, the term "IGBT" refers to as an n-type IGBT unless otherwise specified. Also, in the following descriptions and accompanying drawings, a layer or an area prefixed with a letter n or p means that a large number of electrons or holes are carried, respectively. Also, signs + and − attached to a letter n or p as superscripts mean that impurity concentrations are, respectively, higher and lower than a layer or an area without the sign.

A PT type IGBT has a structure in which an $n^+$-layer (n-buffer layer) is provided between a $p^+$-epitaxial substrate and an $n^-$-layer (n-type active layer) to allow a depletion layer in the n-type active layer to reach the n-buffer layer. This is the basic structure for main stream IGBTs. However, for an IGBT of the 600 V breakdown series, although the n-type active layer needs a thickness only on the order of 70 μm, the total thickness including the $p^+$-epitaxial substrate part may become as thick as on the order of 200 μm to 300 μm. This leads to development of the NPT type IGBT and the FS type IGBT. In each type, no epitaxial substrate is used. Instead, an FZ substrate is used that is formed by the FZ (Floating Zone) method to form therein a shallow $p^+$-collector layer doped with a low dose so as to be thinned and provided at a reduced cost.

FIG. 12 is a view showing an example of a cross-sectional structure of an NPT type IGBT. NPT type IGBT 100 shown in FIG. 12 has a structure in which $n^-$-type FZ (FZ-N) substrate 1 has gate electrode 5 of a material, such as polysilicon, formed on the top surface with gate oxide film 4 of a material, such as $SiO_2$, provided between the substrate and the gate electrode. In this structure, top surface electrode 6, made of an aluminum silicon film, for example, is further formed on gate electrode 5 with interlayer insulator film 7 of a material, such as BPSG (Boro-Phospho Silicate Glass), provided between the top surface electrode 6 and the gate electrode 5. On the top surface side of FZ-N substrate 1, $p^+$-base layer 2 and $n^+$-emitter layer 3 in $p^+$-base layer 2 are formed. On the bottom surface side of FZ-N substrate 1 is formed $p^+$-collector layer 8 on which bottom surface electrode 9 is formed by laminating several kinds of metal films.

In NPT type IGBT 100 with such a structure, for the $p^+$-collector layer 8, a shallow low-level injection $p^+$-collector is used which is doped with a low dose. In NPT type IGBT 100, no $p^+$-epitaxial substrate is used to make the total thickness thereof significantly less as compared with that of the above-described PT type IGBT.

In the NPT structure, hole injection rate can be controlled to enable high-speed switching without performing lifetime control of holes. The value of an on-voltage, which is dependent on the thickness and specific resistance of an n-type active layer, becomes a little higher. The use of the FZ substrate instead of the above-described $p^+$-epitaxial substrate allows a chip with the NPT structure to be produced at a reduced cost.

FIG. 13 is a view showing an example of a cross-sectional structure of an FS type IGBT. In FIG. 13, the same constituents as those shown in FIG. 12 are denoted by the same reference numerals and signs with detailed explanations thereof omitted. For FS type IGBT 200 shown in FIG. 13, as for the above-described NPT type IGBT 100, FZ-N substrate 1 is used instead of the above-described $p^+$-epitaxial substrate, with the total thickness thereof becoming on the order of 100 μm to 200 μm. As in the PT type IGBT, the n-type active layer is made to have a thickness on the order of 70 μm according to a breakdown voltage of 600 V and is made depleted. For this purpose, in FS type IGBT 200, on the bottom surface of FZ-N substrate 1, an $n^+$-layer (n-buffer layer) 10 is formed, and $p^+$-collector layer 8 and bottom surface electrode 9 are formed on the n-buffer layer 10. In FS type IGBT 200, as in the above-described NPT type IGBT 100, lifetime control is unnecessary.

In order to lower the on-voltage, a type of IGBT is used in which an IGBT with a trench structure, having a narrow and deep trench formed on the top surface of the IGBT together with a MOS gate formed on the side wall of the trench, is combined with an IGBT of an FS structure. Recently, total thickness reduction by design optimization also has been carried out.

Using the FS type IGBT 200 shown in the above-described FIG. 13 as an example, one example of a method of forming an IGBT will be explained with reference to FIG. 14 to FIG. 18. FIG. 14 is a cross-sectional view taken after a top surface side process has been completed. FIG. 15 is a cross-sectional view showing a substrate grinding process. FIG. 16 is a cross-sectional view showing a bottom surface side ion-implantation process. FIG. 17 is a cross-sectional view showing a bottom surface annealing process. FIG. 18 is a cross-sectional view showing a bottom surface electrode film-forming process. In FIG. 14 through FIG. 18, the same constituents as those shown in FIG. 12 and FIG. 13 are denoted by the same reference numerals and signs with detailed explanations thereof omitted.

The processes of forming FS type IGBT 200 may be roughly classified into a top surface side process and a bottom surface side process. First, an explanation will be given about the top surface side process with reference to FIG. 14. In the top surface side process, $SiO_2$ and polysilicon are first deposited in that order on the top surface side of FZ-N substrate 1. The deposited $SiO_2$ and polysilicon are then processed to form a window that penetrates gate oxide film 4 and gate electrode 5, respectively. Following this, BPSG is deposited on the surface thereof. The deposited BPSG is then processed to form a window into interlayer insulator film 7. This provides an insulated gate structure formed on the top surface side of FZ-N substrate 1.

Next, $p^+$-base layer 2 is formed on the top surface side of the FZ-N substrate 1 and $n^+$-emitter layer 3 is also formed in $p^+$-base layer 2. Furthermore, an aluminum silicon film is deposited so that it is in contact with $n^+$-emitter layer 3. This layer is top surface electrode 6 that is to become the emitter electrode. The aluminum silicon film is thereafter heat-treated at a low temperature on the order of 400° C. to 500° C. to realize an interconnection with stable compatibility and low resistance.

Although its illustration was omitted in FIG. 13 and FIG. 14, an insulator protective film is formed on the top surface electrode 6 using a material, such as a polyimide, so as to cover the surface thereof. Next, an explanation will be given about the bottom surface side process with reference to FIG. 15 to FIG. 18. In the bottom surface side process, as shown in FIG. 15, FZ-N substrate 1 is first thinned from the bottom surface to a desired thickness by carrying out back grinding or etching to produce a thinned wafer.

Next, as shown in FIG. 16, phosphorous ions ($P^+$) and boron ions ($B^+$) are implanted in this order onto the bottom surface side of FZ-N substrate 1 to form $n^+$-layer 10a and $p^+$-layer 8a, which are thereafter heat-treated (annealed) at a low temperature of 350° C. to 500° C. in an electric furnace. This activates phosphorous-implanted $n^+$-layer 10a and boron-implanted $p^+$-layer 8a to form $n^+$-buffer layer 10 and $p^+$-collector layer 8, respectively, on the bottom surface side of FZ-N substrate 1 as shown in FIG. 17. There may be a case where $BF_2$ is implanted after the implantation of boron so as to form a top surface contact layer (p-layer) that comes in ohmic contact with the bottom surface electrode on the uppermost surface layer of $p^+$-collector layer 8.

Thereafter, as shown in FIG. 18, bottom surface electrode 9 is formed on the surface of $p^+$-collector layer 8. It is made up of a combination of metal layers, such as an aluminum layer, a titanium layer, a nickel layer, and a gold layer. Finally, the wafer is subjected to dicing into chip-like pieces. Then, onto each of the chip-like pieces, aluminum wire electrodes are fixed by means of an ultrasonic wire bonder onto the surface of top surface electrode 6. Bottom surface electrode 9 is connected to a specified fixing piece with a solder layer provided there between.

In recent years, a matrix converter that carries out direct AC to AC conversion without intervention of a direct current has been spotlighted. Unlike previous inverters, the matrix converter requires no capacitor and thereby has an advantage that supply harmonics are reduced. However, an alternating current input requires a semiconductor switch to have a high reverse breakdown voltage. Thus, use of an IGBT of this previous type needed a reverse-blocking diode connected in series thereto.

FIG. 19 is a view showing an example of a cross-sectional structure of a reverse-blocking IGBT. In FIG. 19, the same constituents as those shown in FIG. 12 are denoted by the same reference numerals and signs with detailed explanation thereof omitted. As is shown in FIG. 19, reverse-blocking IGBT 300 is an IGBT which has a basic performance following that of the previous type IGBT with $p^+$-isolation layer 11 further formed so as to provide a high reverse breakdown voltage. For a reverse-blocking IGBT 300 having such a structure, no diode connected in series is necessary to allow conduction loss to be reduced by half. This largely contributes to enhancement of the conversion efficiency of the matrix converter. The technology of forming a deep junction with a depth of 100 µm or more and the technology of producing a very thin wafer with a thickness of 100 µm or less are combined to enable manufacture of a high performance reverse-blocking IGBT.

In manufacturing such an IGBT, however, there are many technical aspects of the manufacturing process that must be addressed in order to realize a thin IGBT with a thickness on the order of 70 µm. These include elimination of warping of the wafer that is caused by necessary processing, such as bottom surface back grinding, ion-implantation to the bottom surface, and bottom surface heat-treatment.

One of the technical aspects of the manufacturing processes is the technique of activating a p-type doped layer (p-layer) or an n-type doped layer (n-layer), which is necessary in order to form various kinds of semiconductor elements including the IGBTs shown here as examples. Various methods have been tried previously for this activation. Besides the method of using an electric furnace as described above, activation of a doped layer has been carried out by annealing using a laser. In this technique, for example, a wafer is secured on a supporting substrate by an adhesive sheet to prevent cracking of the wafer and the wafer is irradiated with a laser beam to activate the p-layer and the n-layer. Activation may be carried out using the second harmonic of a YAG (Yttrium Aluminum Garnet) laser (YAG2ω laser) or the third harmonic thereof (YAG3ω laser).

In activating the p-layer and the n-layer in the case of previous electric furnace annealing, however, the p-layer cannot be made highly activated. Furthermore, in the method of using an adhesive sheet for preventing cracking of the wafer, the permissible temperature of the adhesive sheet is usually 200° C. or less which makes the use of the sheet impossible when the electric furnace annealing needs to be carried out at 300° C. or more.

Moreover, when the p-layer and the n-layer are to be activated by laser annealing instead of electric furnace annealing, irradiation with a short single pulsed laser beam with a full-width at half maximum smaller than 100 ns, such as a pulsed beam of an excimer laser, can activate only to a shallow region from the surface. For example, in pn-successive layers on the bottom surface side of an FS type IGBT where the p-layer and the n-layer are successively provided from the bottom surface in that order, sufficient activation up to the n-layer is impossible. When irradiation is carried out with a beam of an all-solid-state laser, such as the YAG2ω laser and the YAG3ω laser, used in the form of a signal pulse, the irradiation being carried out with a beam spot with a diameter on the order of 0.9 mm, for example, necessitates a long irradiation time. Thus, the processing time for one wafer can be several hours. For example, annealing of a five-inch wafer takes on the order of two hours. Moreover, when one irradiation area is irradiated with a laser beam in which irradiation energy density has been increased, traces of work damage by the laser irradiation sometime remain on the surface of the wafer.

As one measure to address the problems discussed above, the inventor proposed a method of activating a doped layer into which an impurity has been introduced by continuously irradiating plural pulses onto the doped layer from one irradiation area to another with the use of plural laser irradiation devices that irradiate pulsed laser beams, for example, in JP-A-2005-223301 (paragraph numbers 0026 and 0027) and U.S. Pat. No. 7,135,387. Also, a method of activating impurity ions implanted into a deep part of a wafer with the use of a semiconductor laser has been proposed, for example, in JP-A-2006-351659 (paragraph number 0012). Further, use of selenium or sulfur as a dopant when forming an n-doped layer has been proposed, for example, in JP-A-2002-520885 (paragraph numbers 0014 and 0032) and U.S. Pat. No. 6,441,408. Selenium and sulfur have an extremely high diffusion coefficient for silicon as compared with a dopant in the related art.

However, because the diffusion coefficient of a dopant in the related art, such as P (phosphorous) and As (arsenic), is not so large, they hardly diffuse by laser irradiation for an irradiation time on the order of several ns. In addition, the depth of a doped layer that can be activated by laser irradiation is 1.5 µm or less. Hence, for example, in order to activate the $p^+$-collector layer and the n-buffer layer in FS type IGBT by laser irradiation, the $p^+$-collector layer and the n-buffer layer have to be formed shallow. In the case where these layers are formed shallow, flaws or adhesion of dirt frequently occurs on the bottom surface of the substrate during the process steps. Leakage current increases when the n-buffer layer is not formed properly in part because of such flaws or dirt. This raises the problem that device failure readily occurs.

In addition, in the case where a dopant having a large diffusion coefficient is used, the dopant penetrates through the substrate and comes off of the substrate when heat treatment for diffusion and activation is carried out for a long time. This raises another problem in that a desired characteristic cannot be achieved in a stable manner. Further, when a laser beam is irradiated onto a thin wafer using a top surface side process and back grinding from the bottom surface side of the wafer, the surface on the opposite side to the laser beam irradiation surface, that is, the surface on which the gate structure or the like has been formed in the top surface side processing, becomes hot. For example, when the thickness of the wafer is 70 µm, the temperature on the top surface side of the wafer may possibly become as high as about 500° C., which causes the top surface electrode and the insulator protective film on top thereof to melt. This raises still another problem of a broken device.

In order to solve the problems in the related art discussed above, the invention has as an object to provide a method of manufacturing a semiconductor element that can prevent the occurrence of a device failure. Also, the invention has as another object to provide a method of manufacturing a semiconductor element that can manufacture a semiconductor element having satisfactory device characteristics. Further, the invention has as still another object to provide a method of manufacturing a semiconductor element that can prevent breaking of a device by heat induced during laser irradiation.

SUMMARY OF THE INVENTION

In order to solve the above-described problems and achieve the above and other objects, a method of manufacturing a semiconductor element according to a first aspect of the invention includes an ion-implantation step and an activation step. In the ion-implantation step, a dopant having a large diffusion coefficient is used. The dopant having a large diffusion coefficient referred to herein means a material having a diffusion coefficient for silicon larger than a diffusion coefficient for silicon of a dopant generally used in the manufacturing process of a silicon semiconductor, for example, phosphorous (P), arsenic (As), boron (B), or antimony (Sb). Examples of such a material include but not limited to lithium (Li), sulfur (S), selenium (Se), and hydrogen (H). Two or more of these materials can be used in combination.

In the activation step, plural laser irradiation devices are used. A doped layer into which a dopant has been implanted is activated by irradiating plural pulsed laser beams onto the doped layer. In this instance, a doped layer made of a single layer may be activated or successive layers made of a plurality of doped layers having the same conduction type or successive layers made of a plurality of doped layers having different conduction types may be activated. Also, pulsed laser beams may be irradiated by allowing the light source itself to blink or by opening or closing a shutter or the like while allowing the light source to emit light continuously so as to irradiate laser beams for a time needed for activation.

A manufacturing method of a semiconductor element according to a second aspect of the invention is a method of irradiating laser beams onto a doped layer into which a dopant having a large diffusion coefficient has been implanted by combining a solid-state laser or an excimer laser and a semiconductor laser in the activation step. The semiconductor laser irradiates a laser beam continuously to the entire wafer surface during the activation step. The solid-state laser or the excimer laser irradiates a pulsed laser beam. As described above, a pulsed laser beam can be irradiated by allowing the light source itself to blink or by combining a light source that emits light continuously and a shutter or the like. In the activation step in the method according to the first or second aspect, it is preferable to fix a wafer to an electrostatic chuck stage while laser beams are irradiated.

According to the invention, a dopant having a large diffusion coefficient diffuses in the depth direction instantaneously by heat induced during laser irradiation in the activation step. Also, because a long-term heat treatment is not carried out, the dopant will not penetrate through the substrate and come off of the substrate. In addition, the use of a plurality of laser irradiation devices makes it possible to control irradiation time of the laser beams, which in turn makes it possible to adjust diffusion and activation of a dopant having a large diffusion coefficient. More specifically, because a dopant having a large diffusion coefficient is allowed to diffuse deeper for activation than previously possible, the n-buffer layer can be formed thicker than was previously possible. It is thus possible to form the n-buffer layer properly without the unwanted influence of flaws or dirt during the process steps.

When the solid-state laser or the excimer laser and the semiconductor laser are combined, a laser beam having a short wavelength from the solid-state laser or the excimer laser contributes to activation of the dopant on the uppermost top layer on the laser irradiation surface side. The semiconductor laser having a larger absorption coefficient into silicon contributes to diffusion and activation of the dopant to a deep layer.

When the substrate is afloat from the stage during laser irradiation, the cooling effect by heat conduction to the stage is decreased, which causes the temperature of the substrate to rise. However, by irradiating a laser beam while the wafer is fixed to an electrostatic chuck stage, it is possible to suppress the increase in temperature of the substrate during laser irradiation. This effect is noticeable with a thin wafer having a thickness on the order of 70 µm. In particular, when lithium is used as a dopant, this configuration is preferable because diffusion of lithium can be controlled by keeping the temperature of the substrate during laser irradiation below 100° C.

According to the method of manufacturing a semiconductor element of the invention, it is possible to achieve the advantage that the occurrence of device failure can be prevented. Also, it is possible to achieve another advantage in that a semiconductor element having satisfactory device characteristics can be manufactured. Further, it is possible to achieve still another advantage in that breakage of the device by heat induced during laser irradiation can be prevented.

BRIEF DESCRIPTION OF THE SEVERAL VIEWS OF THE DRAWING

FIG. 11 is a view showing diffusion depths of lithium, sulfur, selenium, hydrogen, and phosphorous;

FIG. 12 is a view showing an example of a cross-sectional structure of an NPT type IGBT;

DETAILED DESCRIPTION OF THE INVENTION

Hereinafter, preferred embodiments of a method of manufacturing a semiconductor element of the invention will be described in detail with reference to the accompanying drawings. Although not to be construed as limiting the invention, a case of manufacturing an FS type IGBT will be described by way of example.

First Embodiment

Figure 16:
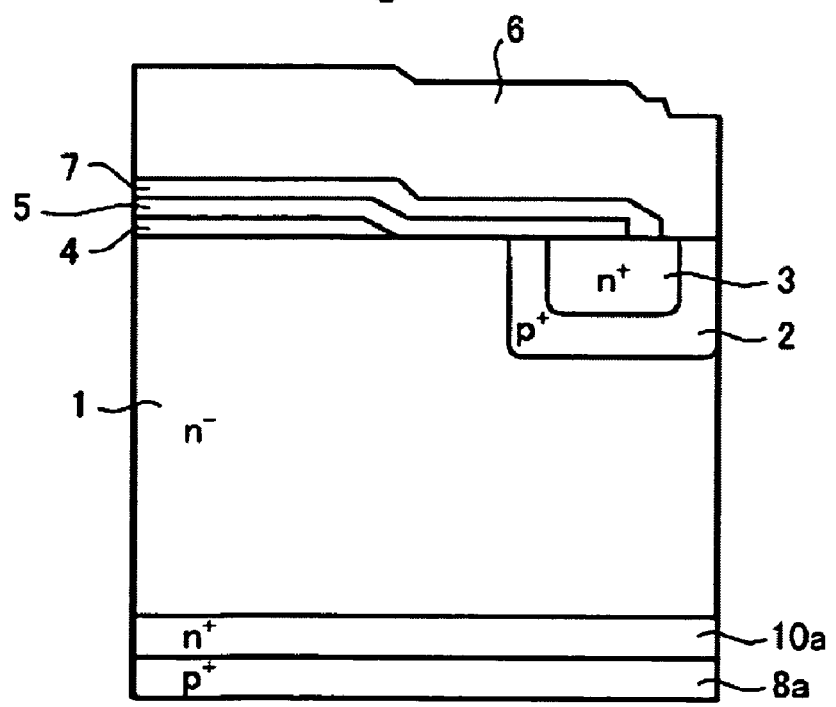
FIG. 16 is a cross-sectional view showing a state in a bottom surface side ion-implantation process.
Figure 17:
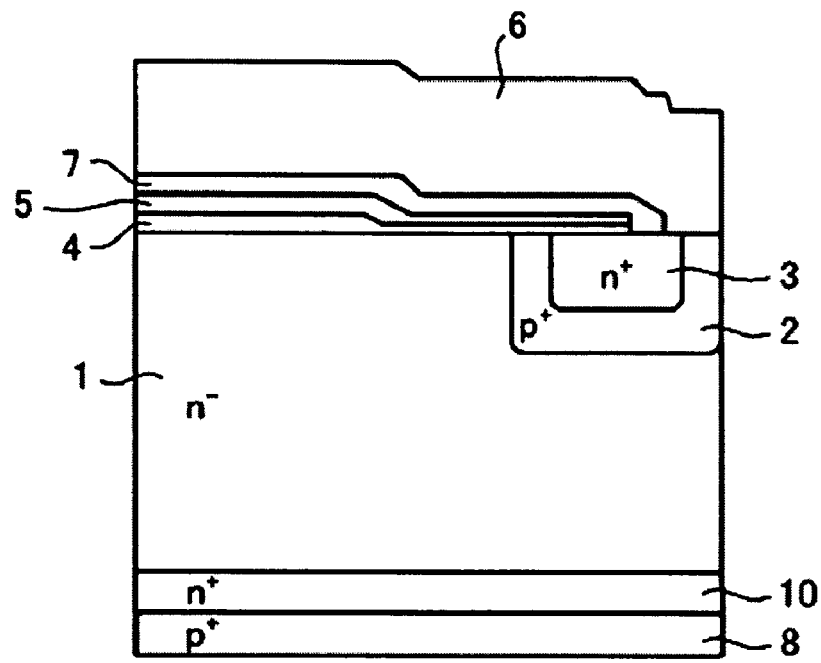
FIG. 17 is a cross-sectional view showing a state in a bottom surface annealing process.
Figure 18:
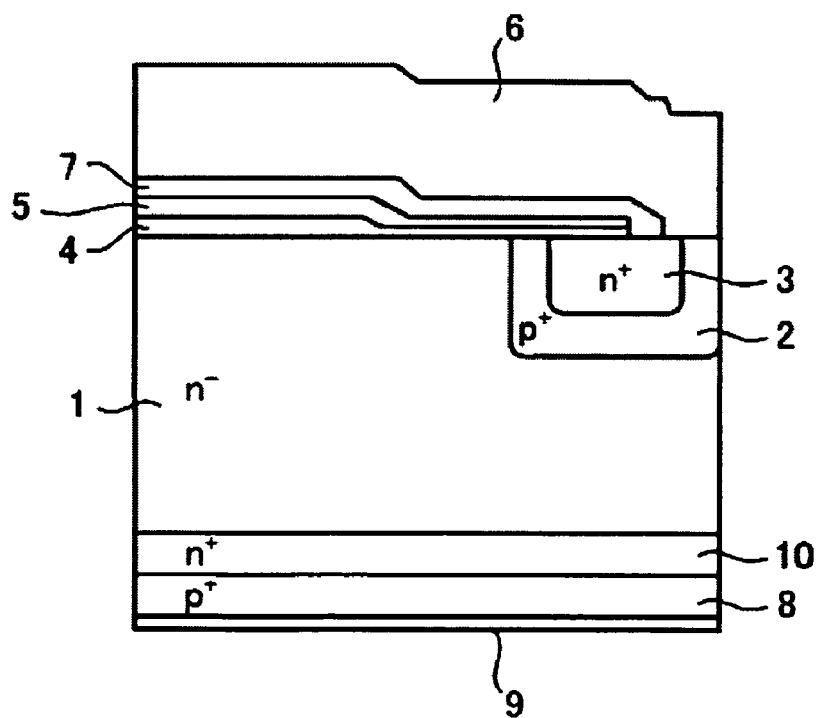
FIG. 18 is a cross-sectional view showing a state in a bottom surface electrode film forming process.
Figure 19:
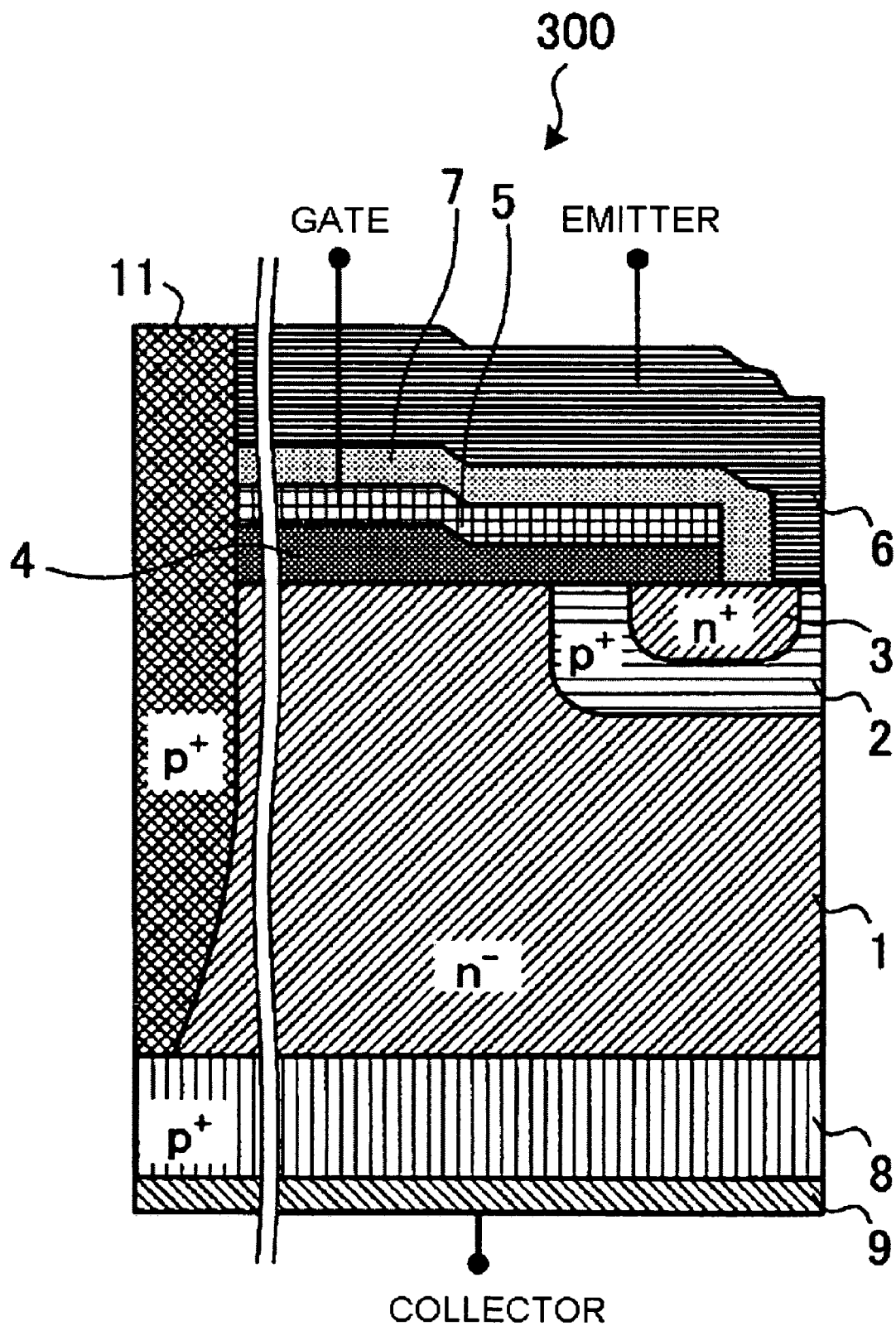
FIG. 19 is a view showing an example of a cross-sectional structure of a reverse-blocking IGBT.

A first embodiment uses lithium as a dopant to form $n^+$-layer 10a in the ion-implantation step to form an n-buffer layer and a $p^+$-collector layer as shown in FIG. 16. In the case where the $n^+$-layer 10a and the $p^+$-layer 8a are activated and a top surface contact layer coming into contact with the bottom surface electrode is provided following this ion-implantation step, two all-solid-state YAG2ω lasers (wavelength: 532 nm) are used to carry out laser annealing in the step of activating the top surface contact layer.

Figure 1:
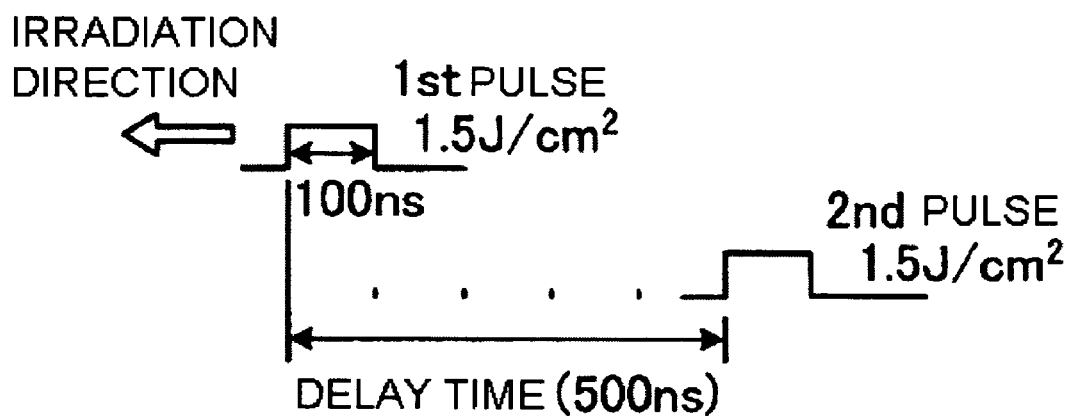
FIG. 1 is a view showing a pulse shape of a pulsed laser beam in a first embodiment.

FIG. 1 is a view showing a pulse shape of a pulsed laser beam irradiated from each of the two laser irradiation devices. As is shown in FIG. 1, when laser beams are irradiated, the full-width at half maximum (corresponding to pulse width) of the both two lasers is, for example, 100 ns. Also, the irradiation energy density of each of the first laser (first pulse) and the second laser (second pulse) is, for example, 1.5 J/cm², so that the laser irradiation energy density becomes 3 J/cm² in total. Further, a delay time of the second pulse from the first pulse is, for example, 500 ns. Furthermore, the overlapping ratio of pulses for each of the first and second lasers is, for example, 90%.

These laser irradiation conditions are chosen as needed according to the diffusion depth and activation ratio of the dopant to achieve a desired characteristic. In order to irradiate a pulsed laser beam, the light source itself may blink or a laser beam may be irradiated for a time needed for activation by opening and closing a shutter or the like while the light source emits light continuously. The pulsed laser beam referred to in the present specification can be achieved by either method. An example where a single doped layer (hereinafter, referred to as a single layer) is activated by laser annealing will now be described. Herein, a case where an n-buffer layer (n-field stop layer) is formed in an FS type IGBT as a single layer is taken as an example. Initially, lithium ($Li^+$) ions are implanted into a silicon semiconductor in the ion-implantation step. In this instance, the dose of lithium is $1 \times 10^{14}$ ($cm^{-2}$) and the acceleration energy is 100 keV. Pulsed laser beams are then irradiated onto the lithium implantation surface under the laser irradiation conditions (see FIG. 1) using two laser irradiation devices.

Figure 2:
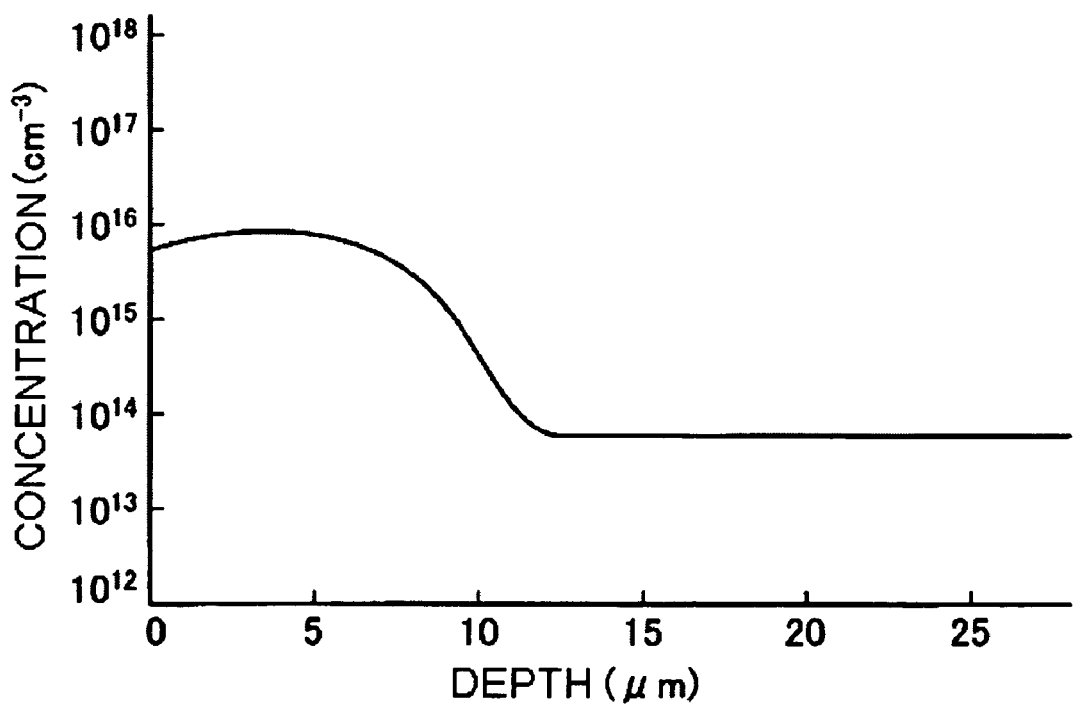
FIG. 2 is a view showing a concentration profile (single layer) in the depth direction of a silicon semiconductor obtained in the first embodiment.

FIG. 2 shows the result of measurement of the concentration profile in the depth direction from the laser irradiation surface in the silicon semiconductor obtained in this manner by the spreading resistance method. Referring to FIG. 2, the depth 0 μm is the laser irradiation surface (the same can be said in FIG. 4, FIG. 6, and FIG. 7). It is understood from FIG. 2 that lithium has diffused to a depth on the order of 12 μm from the laser irradiation surface. It is possible to adjust the diffusion depth and the concentration of lithium by changing the delay time of the second pulse from the first pulse and the irradiation energy density of each of the first pulse and the second pulse.

Figure 3:
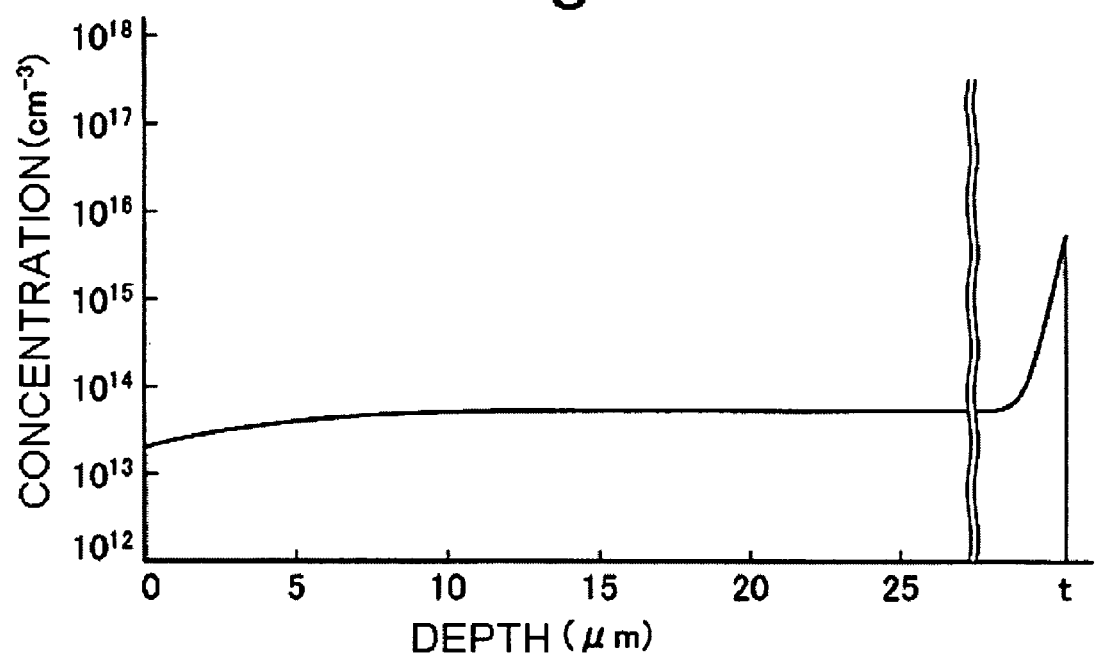
FIG. 3 is a view showing a concentration profile (single layer) in the depth direction of a silicon semiconductor when annealing is carried out in an electric furnace.

For the purpose of comparison, FIG. 3 shows the result of measurement by the spreading resistance method of the concentration profile in the depth direction from the ion-implantation surface in the silicon semiconductor manufactured by implanting lithium ions under the same implantation conditions followed by annealing in an electric furnace at 450° C. for one hour. Referring to FIG. 3, the depth 0 μm is the ion-implantation surface. It is obvious from FIG. 3 that lithium comes off of the silicon semiconductor because of the long-term heat treatment on the surface (at the depth of 0 μm) where lithium was implanted. Also, because the diffusion coefficient of lithium is large, there arises a problem that the concentration increases on the surface (at the depth of t μm) on the opposite side to the implantation surface. Such a problem will not occur when the above-described laser annealing is carried out.

A case of forming the n-buffer layer (n-field stop layer) and the $p^+$-collector layer in the FS type IGBT as successive layers is taken as an example. Initially, in the ion-implantation step, lithium ($Li^+$) ions are implanted into the silicon semiconductor with a dose of $1\times10^{14}$ ($cm^{-2}$) and an acceleration energy of 100 keV. Boron ($B^+$) ions are continuously implanted into the silicon semiconductor with a dose of $1\times10^{15}$ ($cm^{-2}$) and an acceleration energy of 50 keV. Pulsed laser beams are then irradiated to the ion-implantation surface under the above-described laser irradiation conditions (see FIG. 1) with the use of two laser irradiation devices.

Figure 4:
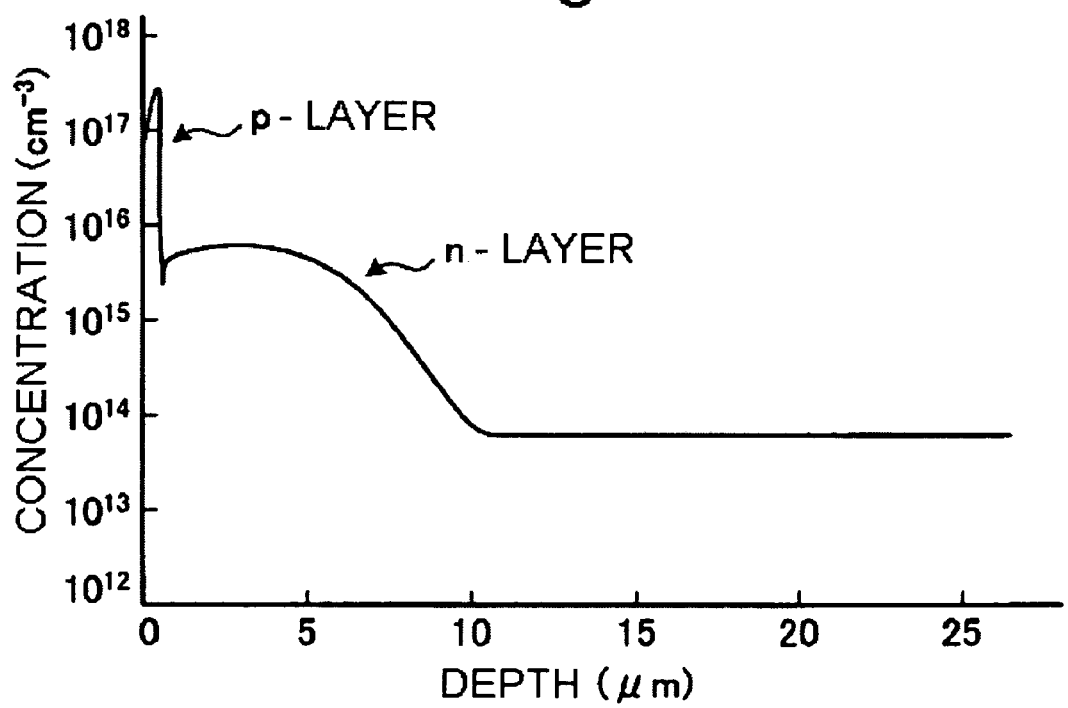
FIG. 4 is a view showing a concentration profile (successive layers) in the depth direction of a silicon semiconductor obtained in the first embodiment.

FIG. 4 shows the result of measurement of the concentration profile in the depth direction from the laser irradiation surface in the silicon semiconductor obtained in this manner by the spreading resistance method. It is understood from FIG. 4 that lithium has diffused to a depth on the order of 10 μm from the laser irradiation surface. The reason why the concentration and the diffusion depth of lithium are reduced slightly as compared with the case of the single layer shown in FIG. 2 is because diffusion of lithium is suppressed by the $p^+$-collector layer. For the successive layers, too, it is possible to adjust the diffusion depth and the concentration of lithium by changing the delay time of the second pulse from the first pulse and the irradiation energy density of each of the first pulse and the second pulse.

Second Embodiment

In a second embodiment, a semiconductor laser (wavelength: 800 nm) is used instead of one of the two all-solid-state YAG2ω lasers (wavelength: 532 nm) used in the first embodiment. Lithium is used as a dopant to form the $n^+$-layer 10a.

Figure 5:
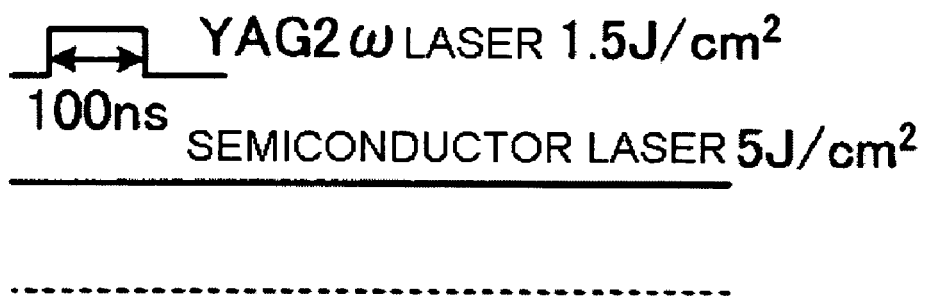
FIG. 5 is a view showing a pulse shape of a pulsed laser beam and a continuous oscillation of a semiconductor laser in a second embodiment.

FIG. 5 is a view showing the pulse shape of a pulsed laser beam irradiated from the all-solid-state YAG2ω laser and the continuous oscillation of the semiconductor laser. As shown in FIG. 5, when laser beams are irradiated, the full-width at half maximum (corresponding to the pulse width) of the all-solid-state YAG2ω laser is, for example, 100 ns. Also, the irradiation energy density of the all-solid-state YAG2ω laser is, for example, 1.5 J/cm². During wafer processing, a laser beam is irradiated to the entire wafer surface from the semiconductor laser at an irradiation energy density of, for example, 5 J/cm². Also, the overlapping ratio of the pulses of the all-solid-state YAG2ω laser is, for example, 90%, These laser irradiation conditions are chosen as needed according to the diffusion depth and the activation ratio of the dopant so as to achieve a desired characteristic. A case where a single layer is activated by laser annealing will now be described. Herein, the case of forming an n-buffer layer (n-field stop layer) in an FS type IGBT as a single layer is taken as an example. Initially, in the ion-implantation step, lithium ($Li^+$) ions are implanted into the silicon semiconductor with a dose of $1\times10^{14}$($cm^{-2}$) and an acceleration energy of 100 keV. Beams are then irradiated onto the lithium implantation surface from the all-solid-state YAG2ω laser and the semiconductor laser under the above-described laser irradiation conditions (see FIG. 5). The irradiation energy density of the semiconductor laser is 3 J/cm².

Figure 6:
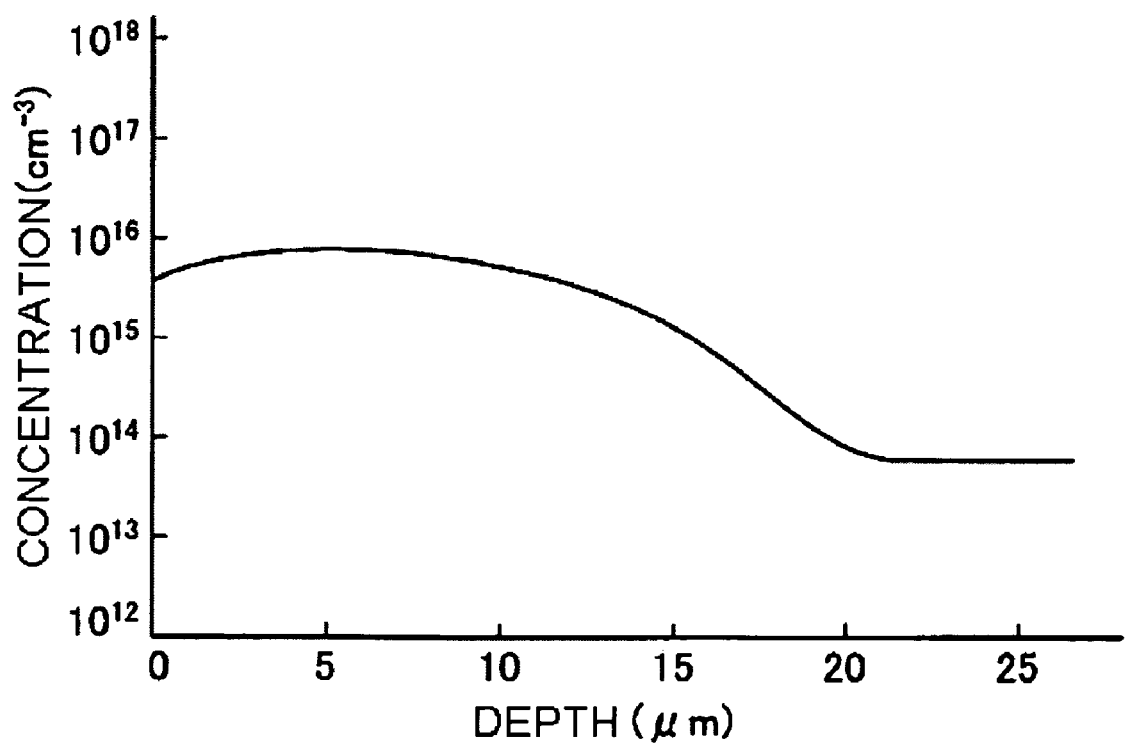
FIG. 6 is a view showing a concentration profile (single layer) in the depth direction of a silicon semiconductor obtained in the second embodiment.

FIG. 6 shows the result of measurement of the concentration profile in the depth direction from the laser irradiation surface in the silicon semiconductor obtained in this manner by the spreading resistance method. It is understood from FIG. 6 that lithium has diffused to a depth on the order of 20 μm from the laser irradiation surface. It is possible to adjust the diffusion depth and the concentration of lithium by changing the irradiation energy density of the all-solid-state laser and the semiconductor laser. A comparison between the result shown in FIG. 6 and the result shown in FIG. 2 reveals that the effectiveness is sufficiently higher in the result shown in FIG. 6. Also, as for the first embodiment, the various problems occurring when long-term annealing is carried out in an electric furnace will not occur, either, in the second embodiment.

Next, a case of forming an n-buffer layer (n-field stop layer) and a $p^+$-collector layer in the FS type IGBT as successive layers is taken as an example. Initially, in the ion-implantation step, lithium ($Li^+$) ions are implanted into the silicon semiconductor with a dose of $1\times10^{14}$ ($cm^{-2}$) and an acceleration energy of 100 keV Boron ($B^+$) ions are continuously implanted into the silicon semiconductor with a dose of $1\times10^{15}$ ($cm^2$) and an acceleration energy of 50 keV. A pulsed laser beam is irradiated onto the ion-implantation surface from the all-solid-state YAG2ω laser at an irradiation energy density of 1.5 J/cm² while a laser beam is irradiated onto the entire ion-implantation surface from the semiconductor laser at an irradiation energy density of 3 J/cm².

Figure 7:
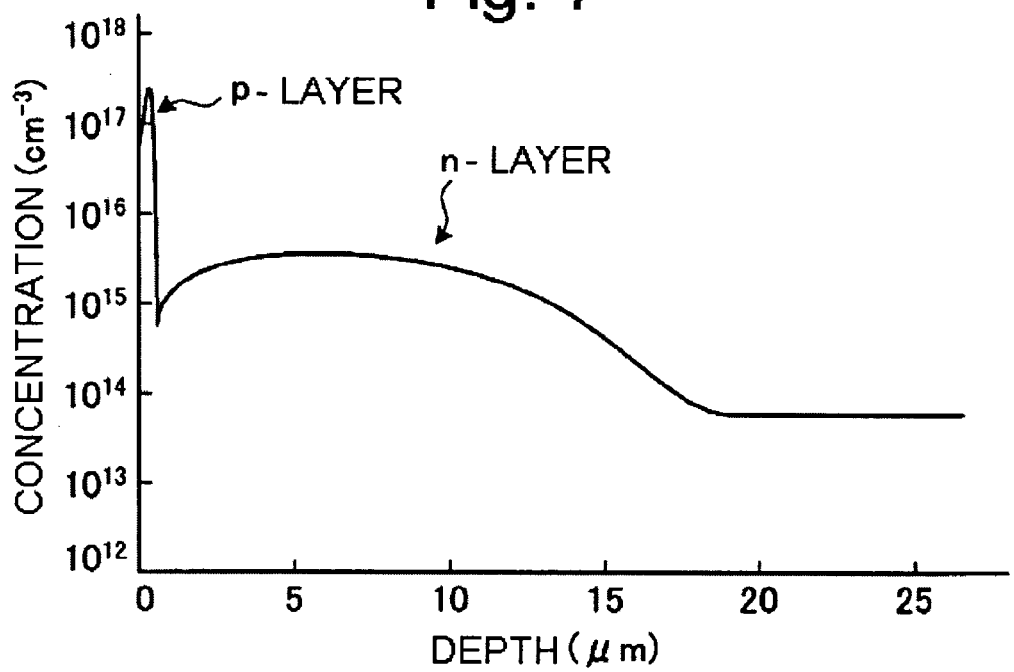
FIG. 7 is a view showing a concentration profile (successive layers) in the depth direction of a silicon semiconductor obtained in the second embodiment.

FIG. 7 shows the result of measurement of the concentration profile in the depth direction from the laser irradiation surface in the silicon semiconductor obtained in this manner by the spreading resistance method. It is understood from FIG. 7 that lithium has diffused to a depth on the order of 18 μm from the laser irradiation surface. The reason why the concentration and the diffusion depth of lithium are reduced slightly as compared with the case of the single layer shown in FIG. 6 is the same as described regarding the first embodiment. For the successive layers, too, it is possible to adjust the diffusion depth and the concentration of lithium by changing the irradiation energy density from the all-solid-state laser and the semiconductor laser.

Figure 8:
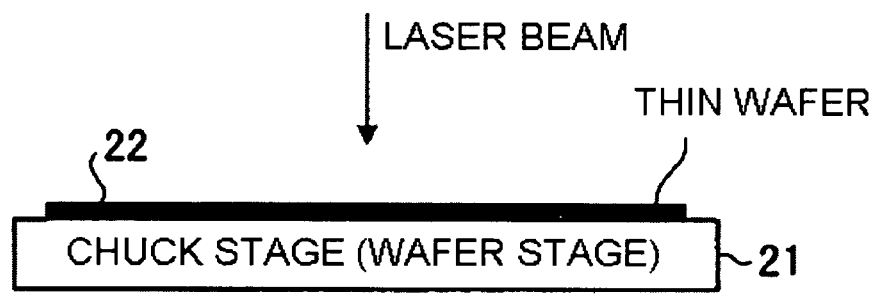
FIG. 8 is a view showing a state where a wafer is fixed to an electrostatic chuck stage.
Figure 9:
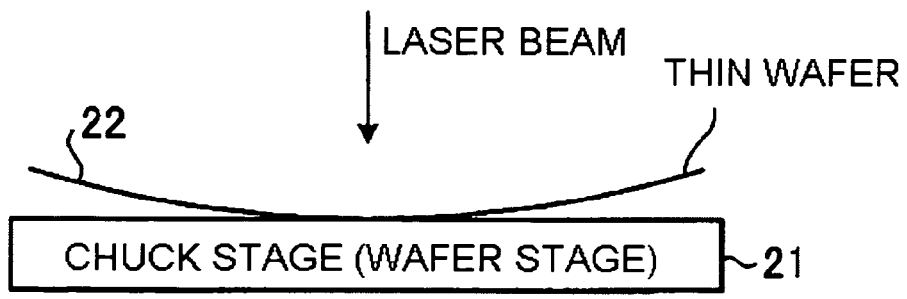
FIG. 9 is a view showing a state where the wafer is afloat from the stage.

Incidentally, in the first embodiment and the second embodiment described above, when laser annealing is carried out, it is preferable to fix wafer 22 firmly to electrostatic chuck stage 21 as shown in FIG. 8. Otherwise, as shown in FIG. 9, the thin wafer 22 may be afloat from stage 21. When the wafer 22 is afloat, heat conductance from the wafer 22 to the stage 21 does not take place easily during laser irradiation, which decreases the cooling effect. As a result, the temperature of wafer 22 rises on the surface on the opposite side to the laser irradiation surface, that is, on the surface on the side opposing the stage 21. On this surface, the gate structure or the like has been formed in the top surface side process.

For example, in a case where the method of the second embodiment is applied to a wafer having a thickness of 70 μm, the temperature of the wafer on the top surface side may rise as high as about 500° C. when the wafer is afloat. When the temperature becomes so high, the top surface electrode and the insulator protective film formed thereon melt and the device is broken and no longer functions as intended. On the contrary, by irradiating laser beams while the wafer 22 is fixed firmly to the electrostatic chuck stage 21, it is possible to suppress the temperature of the wafer on the top surface side to about 200° C. or below. This eliminates the influence of the laser irradiation on the device top surface side.

In the case of a thin wafer having a thickness on the order of 70 μm, this effect is noticeable. In particular, the above-described configuration is preferable in a case where lithium is used as the dopant, because diffusion of lithium can be controlled by keeping the temperature of the substrate during the laser irradiation below 100° C. As has been described, it is effective to manufacture a device that carries out laser annealing while the wafer 22 is fixed to the electrostatic chuck stage 21.

Figure 10:
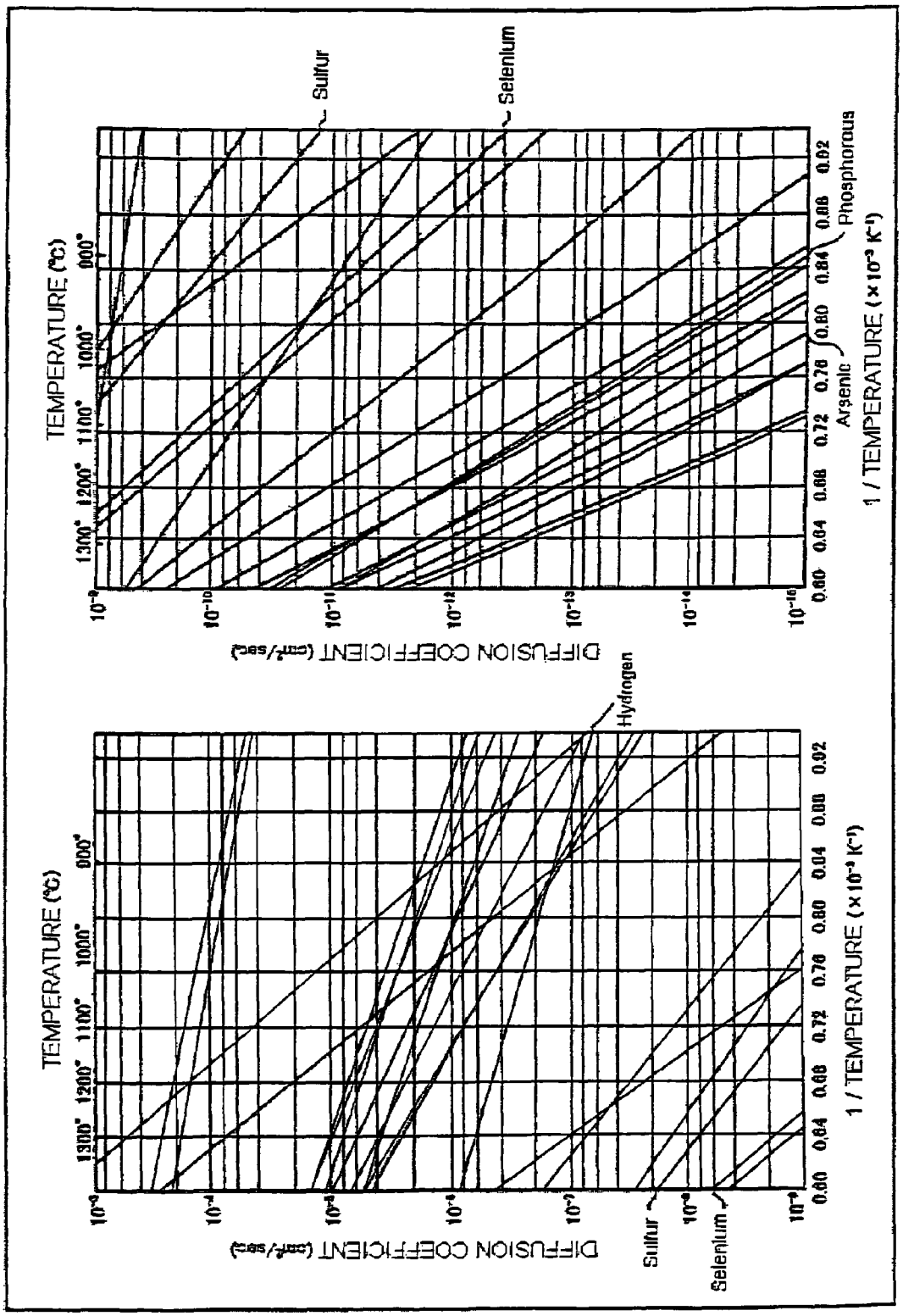
FIG. 10 is a view showing the temperature characteristic of a diffusion coefficient for silicon of sulfur, selenium, hydrogen, arsenic, and phosphorous.
Figure 13:
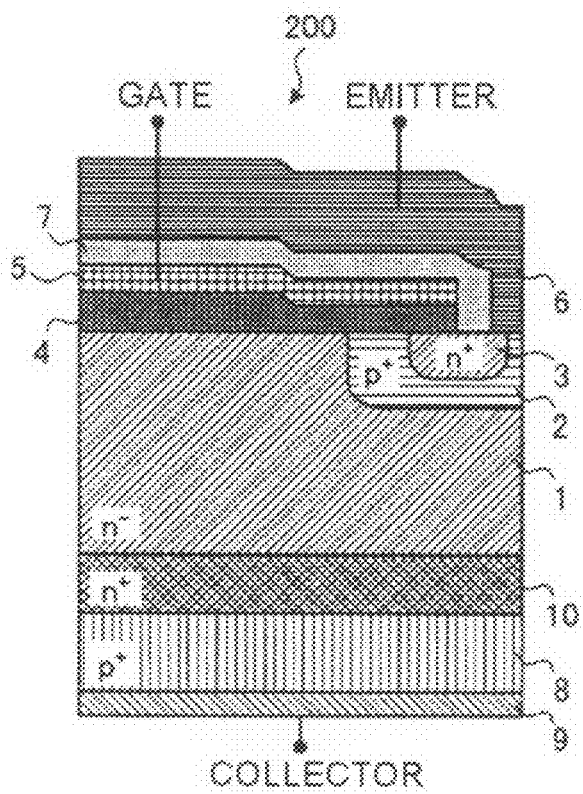
FIG. 13 is a view showing an example of a cross-sectional structure of an FS type IGBT.
Figure 14:
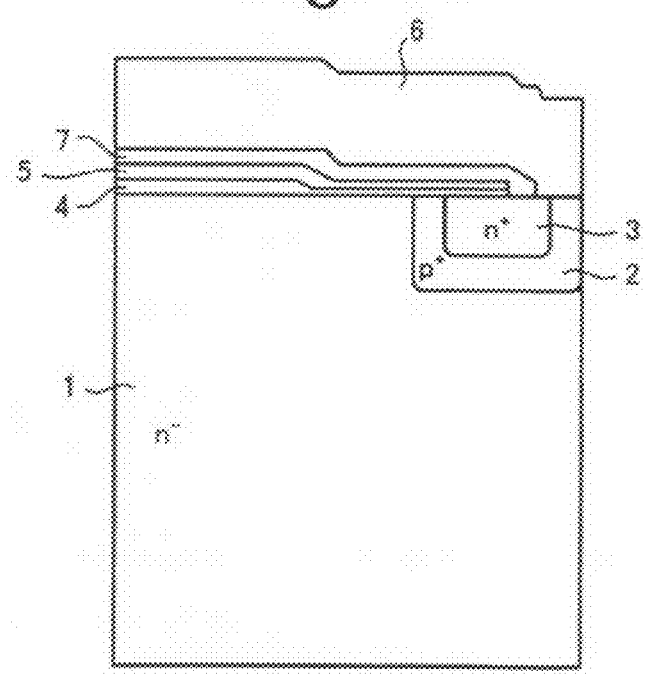
FIG. 14 is a cross-sectional view showing a state after a top surface side process has been completed.
Figure 15:
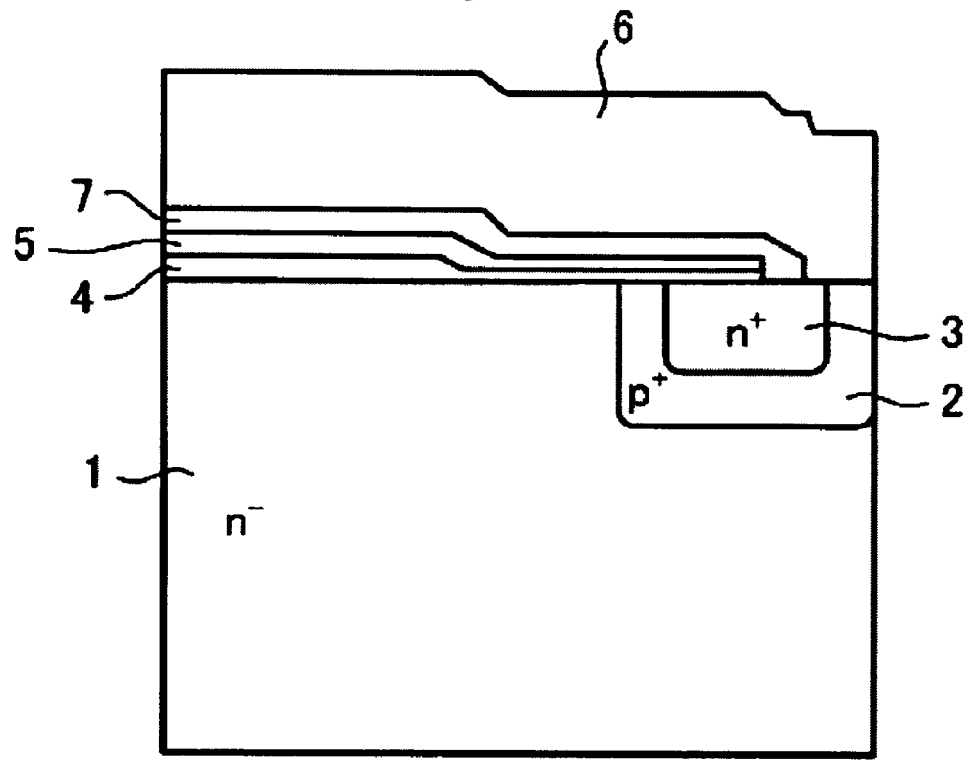
FIG. 15 is a cross-sectional view showing a state in a substrate grinding process.

The first embodiment and the second embodiment describe cases where lithium is used as the dopant. However, sulfur (S), selenium (Se), or hydrogen (H) may be used instead of lithium. FIG. 10 shows the temperature characteristics, with respect to the diffusion coefficient for silicon, of sulfur, selenium, and hydrogen, as well as arsenic and phosphorous for comparison. In FIG. 10, the upper horizontal axis represents a temperature T in centigrade (° C.) and the lower horizontal axis represents an inverse number ($K^{-1}$) of the absolute temperature. The vertical axis represents the diffusion coefficient.

Alternatively, two or more from among lithium, hydrogen, sulfur, and selenium may be used as the dopant. FIG. 11 shows the diffusion depth of each dopant in a case where the second embodiment is applied using lithium, hydrogen, sulfur, and selenium as well as phosphorous as the reference. For each dopant, the dose at the ion-implantation is $1\times10^{14}$ ($cm^{-2}$). The irradiation energy density of the semiconductor laser is 3 J/cm$^2$ and the irradiation energy density of the all-solid-state YAG2ω laser is 1.5 J/cm$^2$. As is obvious from FIG. 10 and FIG. 11, compared with phosphorous and arsenic generally used as the dopant in the manufacturing process of a silicon semiconductor, lithium, hydrogen, sulfur, and selenium have large diffusion coefficients for silicon and therefore diffuse deeper into silicon.

As has been described, according to each embodiment, the dopant having a large diffusion coefficient like lithium, hydrogen, sulfur, and selenium diffuses in the depth direction instantaneously due to the heat induced during the laser irradiation in the activation step. Also, because a long-term heat treatment is not carried out, the dopant will not penetrate through the substrate to come off of the substrate. Further, by using a plurality of laser irradiation devices as in the first embodiment or by combining a solid state laser and a semiconductor laser as in the second embodiment, it is possible to control the laser-beam irradiation time, which makes it possible to adjust the diffusion and the activation of a dopant having a large diffusion coefficient. In particular, according to the second embodiment, the solid-state laser having a short wavelength contributes to the activation of the dopant on the uppermost surface layer on the laser irradiation surface side and the semiconductor laser having a large absorption coefficient into silicon contributes to the diffusion and the activation of the dopant into a deep layer.

Hence, because the dopant, such as lithium, hydrogen, sulfur, and selenium, can be diffused deeper into silicon than before for activation, for example, the n-buffer layer in the FS type IGBT can be formed thicker than before. More specifically, it is possible to form the n-buffer layer properly without the influence of flaws or dirt during the process steps, which can in turn prevent the occurrence of a device failure. In addition, it is possible to manufacture a semiconductor element having satisfactory device characteristics. In addition, by performing laser irradiation while fixing the wafer to the electrostatic chuck stage, not only is it possible to prevent breakage of the device caused by heat induced during laser irradiation, but it is also possible to control diffusion of lithium.

A comparison between the first embodiment (FIG. 2 and FIG. 4) and the second embodiment (FIG. 6 and FIG. 7) reveals that the dopant diffuses deeper into silicon in the second embodiment than in the first embodiment. In addition, FIG. 11 reveals that lithium diffuses most deeply into silicon. It is therefore most preferable to use lithium as the dopant and carry out laser annealing by combining the solid-state laser and the semiconductor laser.

It should be appreciated that the invention is not limited to the embodiments described above and can be modified in various manners. For example, the numerical values specified in the embodiments as the ion-implantation conditions and the laser irradiation conditions are merely examples and the invention is not limited to these values. In addition, the laser annealing method of the invention is not limited to the case of diffusing and activating the n-type dopant, and it is also effective to diffuse and activate a p-type dopant having a large diffusion coefficient, for example, aluminum (Al), zinc (Zn), and gallium (Ga).

Besides the single layer and the pn-successive layers made of a p-type doped layer and an n-type doped layer, the invention is effective to nn-successive layers made of an n-type doped layer and an n-type doped layer, np-successive layers made of an n-type doped layer and a p-type doped layer, successive layers made of an argon introduced layer (Ar layer) into which argon (Ar$^+$) is implanted as an impurity and a p-type doped layer, or successive layers made of an Ar layer and an n-type doped layer. Also, besides the YAG2ω laser, YLF2ω, YVO4 (2ω), YAG3ω, YLF3ω, and YVO4 (3ω) lasers can be used as the all-solid-state laser. Also, XeCl, KrF, and KeF lasers can be used as an excimer laser instead of the all-solid-state laser. Further, a p-layer made of a single layer (collector layer) in the NPT type IGBT or the reverse-blocking IGBT may be activated by the laser annealing method of the invention. Furthermore, the application of the invention is not limited to the IGBTs and the invention is also applicable to the manufacture of a semiconductor element, such as an IC and a MOS.

As has been described, the method of manufacturing a semiconductor element of the invention is useful to manufacture a semiconductor element having a thin device thickness, and particularly suitable to manufacture IGBTs used in the industrial applications, which include devices, such as general-purpose inverters, AC servo devices, uninterruptible power sources (UPS), and switching power sources, as well as consumer applications, which include devices, such as microwave ranges, electric rice cookers, and strobes.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A method of manufacturing a semiconductor element, comprising:

implanting ions of a dopant having a large diffusion coefficient into a semiconductor to provide a doped layer; and irradiating the doped layer with a plurality of pulsed laser beams, and with at least one continuous laser beam, supplied by a plurality of laser irradiation devices to activate the doped layer and provide an activated doped layer that is one of a single doped layer or a plurality of successive doped layers which each have respective conduction types that are one of identical or different.

2. The method of manufacturing a semiconductor element according to claim 1, wherein the dopant is at least one material selected from the group consisting of lithium, sulfur, selenium, and hydrogen.

3. The method of manufacturing a semiconductor element claim 2, wherein the semiconductor is a wafer, and wherein the method further comprises, prior to irradiating, affixing the wafer to a stage of an electrostatic chuck during laser irradiation.

4. The method of manufacturing a semiconductor element claim 1, wherein the semiconductor is a wafer, and wherein the method further comprises, prior to irradiating, affixing the wafer to a stage of an electrostatic chuck during laser irradiation.

5. A method of manufacturing a semiconductor element, comprising:
implanting ions of a dopant having a large diffusion coefficient into a semiconductor to provide a doped layer; and
irradiating the doped layer with laser beams (a) from one of a pulsed solid-state laser or a pulsed excimer laser, and (b) from a continuous semiconductor laser to activate the doped layer and provide an activated doped layer that is one of a single doped layer or a plurality of successive doped layers which each have respective conduction types that are one of identical or different.

6. The method of manufacturing a semiconductor element according to claim 1, wherein irradiating the doped layer with laser beams is accomplished (a) with said plurality of pulsed laser beams from one of a solid-state laser and an excimer laser and (b) with said continuous laser beam from a semiconductor laser.

7. The method of manufacturing a semiconductor element according to claim 6, wherein the semiconductor is a wafer, and wherein the continuous laser beam from the semiconductor laser irradiates a surface of the wafer in its entirety.

8. The method of manufacturing a semiconductor element according to claim 7, wherein the dopant is at least one material selected from the group consisting of lithium, sulfur, selenium, and hydrogen.

9. The method of manufacturing a semiconductor element according to claim 8, wherein the method further comprises, prior to irradiating, affixing the wafer to a stage of an electrostatic chuck during laser irradiation.

10. The method of manufacturing a semiconductor element according to claim 7, wherein the method further comprises, prior to irradiating, affixing the wafer to a stage of an electrostatic chuck during laser irradiation.

11. The method of manufacturing a semiconductor element according to claim 6, wherein the dopant is at least one material selected from the group consisting of lithium, sulfur, selenium, and hydrogen.

12. The method of manufacturing a semiconductor element according to claim 11, wherein the semiconductor is a wafer, and wherein the method further comprises, prior to irradiating, affixing the wafer to a stage of an electrostatic chuck during laser irradiation.

13. The method of manufacturing a semiconductor element according to claim 6, wherein the semiconductor is a wafer, and wherein the method further comprises, prior to irradiating, affixing the wafer to a stage of an electrostatic chuck during laser irradiation.

14. The method of manufacturing a semiconductor element according to claim 5, wherein the dopant is at least one material selected from the group consisting of lithium, sulfur, selenium, and hydrogen.

15. The method of manufacturing a semiconductor element according to claim 14, wherein the semiconductor is a wafer, and wherein the method further comprises, prior to irradiating, affixing the wafer to a stage of an electrostatic chuck during laser irradiation.

16. The method of manufacturing a semiconductor element according to claim 5, wherein the semiconductor is a wafer, and wherein the method further comprises, prior to irradiating, affixing the wafer to a stage of an electrostatic chuck during laser irradiation.

* * * * *